United States Patent
Tu et al.

(10) Patent No.: US 8,466,731 B2
(45) Date of Patent: Jun. 18, 2013

(54) METHOD FOR PREVENTING THE OVER-STRESS OF MV DEVICES

(75) Inventors: Nang Ping Tu, Hsin-Chu (TW); Chun Hao Liao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 159 days.

(21) Appl. No.: 12/986,617

(22) Filed: Jan. 7, 2011

(65) Prior Publication Data

US 2012/0176187 A1    Jul. 12, 2012

(51) Int. Cl.
*H03L 5/00* (2006.01)
*H03K 5/08* (2006.01)

(52) U.S. Cl.
USPC ............ 327/309; 327/312; 327/313; 327/314

(58) Field of Classification Search
USPC ....................... 327/306–333; 361/56, 90–91.8
See application file for complete search history.

(56) References Cited

U.S. PATENT DOCUMENTS

| | | | |
|---|---|---|---|
| 6,191,623 B1 * | 2/2001 | Gabara | 327/71 |
| 6,332,661 B1 * | 12/2001 | Yamaguchi | 327/108 |
| 6,538,866 B1 * | 3/2003 | Hanzawa et al. | 361/91.1 |
| 6,781,806 B2 * | 8/2004 | Hashimoto et al. | 361/91.1 |
| 7,884,646 B1 * | 2/2011 | Bourstein | 326/81 |
| 2004/0257111 A1 * | 12/2004 | Tobita | 326/80 |
| 2012/0105142 A1 * | 5/2012 | Im | 327/543 |

\* cited by examiner

*Primary Examiner* — Lincoln Donovan
*Assistant Examiner* — Brandon S Cole
(74) *Attorney, Agent, or Firm* — Slater & Matsil, L.L.P.

(57) ABSTRACT

A device includes a first power supply line carrying a first positive power supply voltage, and a second power supply line carrying a second positive power supply voltage lower than the first positive power supply voltage. The device further includes a protection circuit having a MOS transistor. A diode is coupled to the MOS transistor. The source-to-drain path of the MOS transistor and the diode are serially coupled between the first and the second power supply lines. The diode is forward biased by the first and the second positive power supply voltages.

18 Claims, 2 Drawing Sheets

METHOD FOR PREVENTING THE OVER-STRESS OF MV DEVICES

BACKGROUND

Integrated circuits often have devices that are operated under several operation voltages, and the devices can be categorized as low-voltage devices, medium-voltage devices, and high-voltage devices. The voltages corresponding to the low-voltage devices, the medium-voltage devices, and the high-voltage devices vary. For example, the low-voltage devices may be operated at 4.5V or below, the medium-voltage devices may be operated between about 4.5V and 18V, and the high-voltage devices may be operated at 18V or above.

To meet the needs of different devices, multiple power supply lines are formed in the integrated circuits to carry different power supply voltages, wherein the power supply voltages may be referred to as a full VDD (FVDD, which is a high voltage), a half VDD (which is also referred to as a medium voltage, or MV, since it is lower than the FVDD), and a low VDD (LVDD). In a high-voltage application, the power-on sequence is that power supply voltage FVDD is activated first. Power supply voltage HVDD, however, is activated at a slower pace than power supply voltage FVDD is. Accordingly, a weak time occurs when power supply voltage FVDD has aroused significantly, while power supply voltage HVDD has not. The voltage different between power supply voltages FVDD and the HVDD during the weak time may be much higher than the normal voltage difference (FVDD'−HVDD) during a normal operation time of the respective circuit. For example, during the normal operation of the integrated circuit, power supply voltage FVDD is 27V, and power supply voltage HVDD is 13.5V. The normal voltage difference (FVDD'−HVDD) is thus 13.5V. However, during the weak time, if power supply voltage FVDD has reached 27V, while power supply voltage HVDD reaches only 2V, the voltage difference is 25V. In the worst case scenario, when power supply voltage FVDD reaches it peak voltage, power supply voltage HVDD is still at 0V. The difference between power supply voltages FVDD and HVDD is thus 27V.

The weak time may be as long as 1 second. During which time, the medium-voltage devices that are coupled between power supply lines carrying power supply voltages FVDD and HVDD also suffer from the high voltage difference. Accordingly, the medium-voltage devices are over-stressed. This may cause reliability problems since the over-stressed medium-voltage devices may breakdown.

To improve the reliability of the medium-voltage devices, the medium-voltage devices may be designed to be able to sustain power supply voltage FVDD. This solution, however, causes the chip area occupied by the medium-voltage devices to increase significantly. In some cases, a 50 percent increase in the chip area may be needed. Another conventional method to improve the reliability is to forwardly couple a diode between a control bias voltage and the power supply line that carries power supply voltage HVDD. During the weak time, the control bias voltage is applied to the forward diode to pull up the HVDD rapidly, so that the difference between power supply voltages FVDD and HVDD is reduced during the weak time. Since the forwardly coupled diode may cause a high current, a resistor is further coupled between the control bias voltage and the power supply line that carries power supply voltage HVDD in order to limit the forward current. However, the resistance value of the resistor needs to be high, and hence the resistor occupies a large chip area.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel medium-voltage (MV)-device protection circuit is provided in accordance with an embodiment. The variations and the operation of the embodiment are discussed. Throughout the various views and illustrative embodiments, like reference numbers are used to designate like elements.

Figure 1:
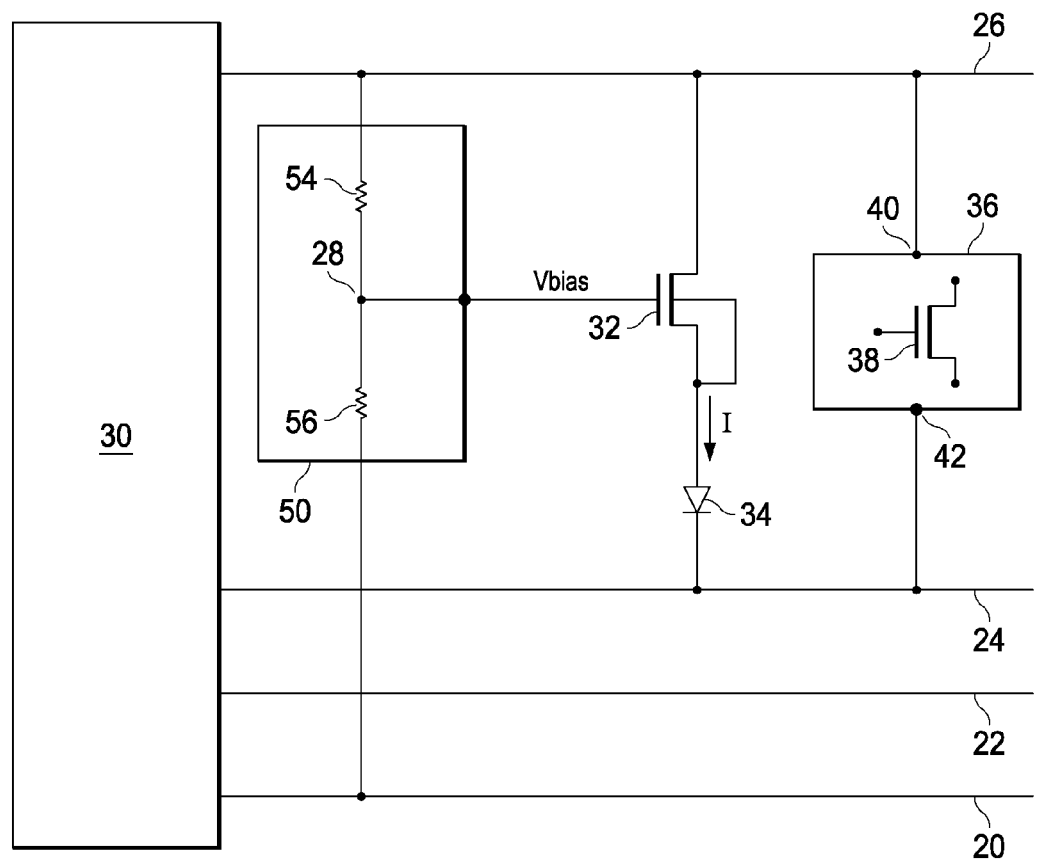
FIG. 1 illustrates a circuit diagram of a medium-voltage (MV) device protection circuit in accordance with an embodiment.

FIG. 1 illustrates a circuit diagram of a MV-device protection circuit in accordance with an embodiment. In an embodiment, four power supply lines 20, 22, 24, and 26 are provided. Power supply line 20 is a VSS line carrying a VSS voltage, which may be at 0V, and may be connected to the electrical ground. Power supply line 22 is a low-voltage (LV) line, which carries positive power supply voltage LVDD lower than about 4.5V, for example. Power supply line 24 is a MV line carrying a medium positive power supply voltage. Throughout the description, power supply line 24 is also referred to as a HVDD line, and the respective voltage is referred to as power supply voltage HVDD. Power supply voltage HVDD is higher than power supply voltage LVDD, and may be between about 4.5V and about 18V. Power supply line 26 is a high-voltage line carrying a high positive power supply voltage, which is referred to as a full VDD (FVDD) throughout the description. Power supply voltage FVDD is higher than power supply voltage HVDD, and may be between about 18V and about 27V. It is realized that the above recited voltages are merely examples, and may be different in different circuits. Power supply voltages LVDD, HVDD, and FVDD may be generated by power supply circuit(s) 30, which may be a single power supply circuit or includes a plurality of power supply circuits. Accordingly, power supply lines 22, 24, and 26 are connected to power supply circuit 30. In the following discussed examples, power supply voltage HVDD is assumed as being 13.5V, and power supply voltage FVDD is assumed as being 27V, which voltages are measured after the respective circuits are fully powered on.

During the following discussion, the voltage on power supply line 26 is referred to as a full-scale FVDD when it is at the fully scale of the designed value, for example, 27V. During the power-on time of power supply circuit 30, however, the voltage on power supply line 26 may be lower than the full-scale FVDD, and the respective voltage is referred to as FVDD'. Similarly, the voltage on power supply line 24 is referred to as full-scale HVDD when it reaches the fully scale of the designed value, for example, 13.5V. During the power-on time of power supply circuit 30, however, the voltage on power supply line 24 may be lower than full-scale HVDD, and the respective voltage is referred to as HVDD'. During the power-on time, voltages FVDD' and HVDD' may increase over time, until they eventually reach full-scale voltages FVDD and HVDD, respectively.

The source-to-drain path of high-voltage (HV) MOS transistor 32 and high-voltage diode 34 are coupled in series between power supply lines 26 and 24, with diode 34 being forwardly biased by voltages FVDD' and HVDD'. In an embodiment, the drain of HVMOS transistor 32 is connected directly to power supply line 26. The anode of HV diode 32 is coupled to, and may be connected directly to, the source of HVMOS transistor 32. With the forward bias, the anode of HV diode 32 is coupled to a higher voltage than the cathode. The cathode of HV diode 34 may be coupled to, and may be connected directly to, power supply line 24.

MV-device-comprising circuit 36 is also coupled between power supply lines 26 and 24. MV-device-comprising circuit 36 comprises MV devices 38, which are represented by a transistor. MV devices 38 are designed to be able to sustain (without being over-stressed) the medium high voltage HVDD carried by power supply line 24. Furthermore, MV devices 38 are coupled between power supply lines 24 and 26, and hence are designed to sustain (without being over-stressed) voltage difference (FVDD−HVDD), which may be 13.5V, for example. In an embodiment, MV devices 38 are not designed to sustain power supply voltage FVDD, and are not designed to sustain voltage difference (FVDD−VSS). Alternatively stating, MV devices 38 have maximum endurable voltages lower than full-scale FVDD. When operated under the voltages higher than the maximum endurable voltages, MV devices 38 are over-stressed, and may breakdown and be damaged. For example, the maximum endurable voltages of MV devices 38 may be about 80 percent FVDD. Accordingly, when the voltage difference at nodes 40 and 42 is close to FVDD, MV devices 38 may be over-stressed, and may breakdown. In alternative embodiments, MV devices 38 are designed to sustain FVDD, and if the voltage difference at nodes 40 and 42 is equal to FVDD, MV devices 38 are not over-stressed.

Control bias circuit 50 provides bias voltage Vbias to the gate of high-voltage MOS (HVMOS) transistor 32. In an embodiment, bias voltage Vbias is proportional to voltage FVDD', and may be expressed as n*FVDD'. Ratio n may be a substantially constant value smaller than 1. In an embodiment, ratio n is smaller than or equal to 0.5. Ratio n may also be between about 0.2 and about 0.5, or between about 0.1 and about 0.5. For the MV-device protection circuit to provide an efficient protection, however, ratio n cannot be too small, and may be greater than about 0.1, or greater than about 0.2. During the power on time in which voltage FVDD' rises with time, bias voltage Vbias also rises with the rising of FVDD'. In an exemplary implementation, control bias circuit 50 includes resistors 54 and 56 coupled between power supply lines 26 and 20, and the voltage at node 28, which is between resistors 54 and 56, is bias voltage Vbias. Control bias circuit 50 may also have various other designs to achieve the similar functions.

Figure 2:
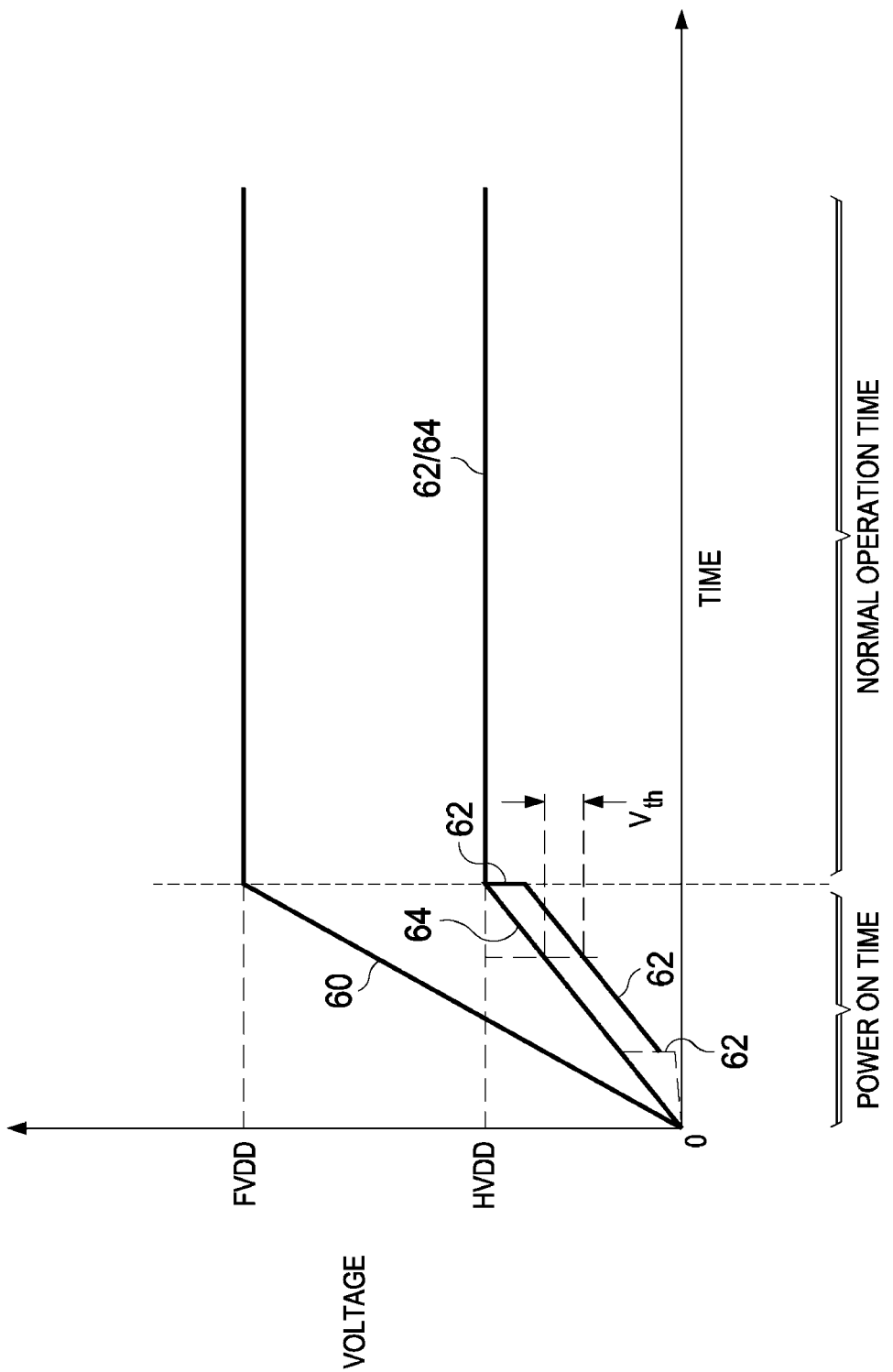
FIG. 2 schematically illustrates a time sequence diagram in the operation of the MV-device protection circuit.

An operation of the MV-device protection circuit is briefly discussed as follows. FIG. 2 illustrates an exemplary time sequence diagram showing the operation of the MV-device protection circuit. During the power on time, When voltage FVDD' (line 60 in FIG. 2) on power supply line 26 (FIG. 1) rises starting from 0V, voltage HVDD' (dotted line 62 in FIG. 2) on power supply line 24 (FIG. 1) rises at a slower pace than FVDD'. Accordingly, the voltage difference (FVDD'−HVDD') between power supply lines 26 and 24 increases with time. In the worst case scenario, in the initial stage during which voltage FVDD' rises, voltage HVDD' stays at 0V. Bias voltage Vbias (denoted as line 64), which is n*FVDD', however, rises with voltage FVDD' (line 60) proportionally. When bias voltage Vbias (64) is equal to or higher than the threshold voltage Vth of HVMOS transistor 32, HVMOS transistor 32 is turned on, and voltage HVDD' (line 62) is pulled up. Voltage HVDD' 62 may be roughly expressed as (n*FVDD'−Vth). Accordingly, the voltage difference between nodes 40 and 42 (FIG. 1) is (FVDD'−n*FVDD'+Vth). If n is 0.5, the voltage difference is about (0.5FVDD'+Vth). As a result, the maximum voltage applied on MV devices 38 (FIG. 1) is limited, and MV devices 38 are protected from the over-stress.

Power supply circuit 30 (FIG. 1) will eventually pull up the voltage HVDD', although may be at a slower pace than control bias voltage Vbias. When voltage HVDD' 62 on power supply line 24 (FIG. 1) reaches (HVDD−Vth) or higher, HVMOS transistor 32 is turned off to allow power supply circuit 30 to pull up voltage HVDD' to HVDD freely. After the power on time, the respective circuit are under a normal operation (marked by the Normal Operation Time in FIG. 2), during which time the power supply voltage on power supply line 24 is equal to full-scale HVDD, while the power supply voltage on power supply line 26 is equal to full-scale FVDD.

Referring back to FIG. 1, HVMOS transistor 32 also has the function of regulating current I flowing through HV diode 34 since HV diode 34 may generate a high current if applied with bias voltage Vbias without the regulation of HVMOS transistor. To limit the forward current I (which is a leakage current) flowing through HV diode 34, which current may be in the order of milliamps, the W/L ratio of HVMOS transistor 32, which is the ratio of channel width to channel length of HVMOS transistor 32, may be adjusted to a desirable level. In an embodiment, the W/L ratio is adjusted so that during the power on time, current I flowing through the drain-to-source path of HVMOS transistor 32 is close to (for example, between 80 percent to about 120 percent) the normal operation current flowing from power supply line 26 to power supply line 24. The operation current is also the current pulled by all circuits coupled between power supply lines 26 and 24, which circuits includes MV-device-comprising circuit 36. With current I being close to the normal operation current, the current required for pulling up voltage HVDD' is relatively high so that the pulling up may be performed in time, while the resulting leakage is controlled.

HVMOS transistor 32 may adopt various HV MOS transistor, including symmetric and asymmetric HVMOS structures. The maximum endurable voltage of HVMOS transistor 32 may be equal to or higher than full-scale FVDD, so that when under full-scale FVDD, HVMOS transistor 32 is not over-stressed. On the other hand, HV diode 34 may also adopt various structures. For example, HV diode 34 may be a P+ double-diffusion diode including a high-voltage n-well. In an embodiment, the maximum endurable voltage of HV diode 34 is lower than full-scale FVDD, which means that when operated under the full-scale FVDD, HV diode 34 may be over-stressed. In alternative embodiments, the maximum endurable voltage of HV diode 34 is higher than full-scale FVDD, so that when under full-scale FVDD, HV diode 34 is not over-stressed. After HVMOS transistor 32 is turned off, HV diode 34 shares the voltage difference (FVDD−HVDD) with HVMOS transistor 32.

In embodiments, with the addition of HVMOS transistor 32, the highest voltage applied to MV devices 38 is limited to about (FVDD−HVDD). Accordingly, MV devices 38 may be designed to sustain voltage HVDD, and do not have to (although they can) be designed to sustain voltage FVDD. Accordingly, the chip area occupied by MV-device-comprising circuit 36 may be reduced.

In accordance with embodiments, a device includes a first power supply line carrying a first positive power supply voltage, and a second power supply line carrying a second positive power supply voltage lower than the first positive power supply voltage. The device further includes a protection circuit having an NMOS transistor. A diode is coupled to the NMOS transistor. The source-to-drain path of the NMOS transistor and the diode are serially coupled between the first and the second power supply lines. The diode is forward biased by the first and the second positive power supply voltages.

In accordance with other embodiments, a device includes a first power supply line carrying a first positive power supply voltage; a second power supply line; a third power supply line; and a power supply circuit coupled to the first, the second, and the third power supply lines. The power supply circuit is configured to supply a first positive power supply voltage to the first power supply line, a second positive power supply voltage lower than the first power supply voltage to the second power supply line, and a third positive power supply voltage lower than the first and the second power supply voltages to the third power supply line. A protection circuit includes a MOS high-voltage transistor having a drain coupled to the first power supply line; and a diode including an anode coupled to a source of the MOS high-voltage transistor, and a cathode coupled to the second power supply line. A control bias circuit includes an output coupled to a gate of the MOS transistor. The control bias circuit is configured to output a bias voltage to the gate, with the bias voltage being substantially equal to a constant times the first positive power supply voltage. The control bias circuit is configured to adjust the bias voltage in response to a change in the first positive power supply voltage.

In accordance with yet other embodiments, during a power on time of a power supply circuit, a control bias voltage is generated. A first voltage on a FVDD power supply line rises faster than a second voltage on a HVDD power supply line, wherein the control bias voltage is proportional to, and is smaller than, the first voltage. The FVDD power supply line and the HVDD power supply line receive the first and the second voltages, respectively, from the power supply circuit. A MOS transistor is turned on when its gate is supplied with the control bias voltage. The second voltage on the HVDD power supply line is pulled up by a source voltage of the MOS transistor. During a normal operation time of the power supply circuit, with the normal operation time being after the power on time, the MOS transistor is turned off to stop the step of pulling up the second voltage.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a first positive power supply line carrying a first positive power supply voltage;
    a second power supply line carrying a second positive power supply voltage lower than the first positive power supply voltage;
    a protection circuit comprising a MOS transistor, with the MOS transistor comprising a source-to-drain path;
    a diode, wherein the source-to-drain path of the MOS transistor and the diode are serially coupled between the first and the second power supply lines, and wherein the diode is forward biased by the first and the second positive power supply voltages; and
    a control bias circuit comprising:
        an output coupled to a gate of the MOS transistor, wherein the control bias circuit is configured to output a bias voltage to the gate, with the bias voltage being proportional to, and smaller than, the first positive power supply voltage; and
        a first resistor and a second resistor coupled in series between the first power supply line and a VSS line, with a node between the first and the second resistors coupled to the gate of the MOS transistor.

2. The device of claim 1, wherein the bias voltage is equal to a constant times the first positive power supply voltage, with the constant being greater than 0 and smaller than about 0.5.

3. The device of claim 2, wherein the constant is between about 0.3 and about 0.5.

4. The device of claim 1, wherein the control bias circuit is configured to generate the bias voltage proportional to the first positive power supply voltage during a period of time the first positive power supply voltage rises from 0V to a full-scale FVDD.

5. The device of claim 1, wherein the MOS transistor is an NMOS high-voltage transistor comprising a drain connected directly to the first power supply line, and a source connected to an anode of the diode, and wherein an cathode of the diode is connected to the second power supply line.

6. The device of claim 1 further comprising a power supply circuit coupled to the first and the second power supply lines, wherein the power supply circuit is configured to generate the first and the second positive power supply voltages.

7. The device of claim 1, wherein the first positive power supply voltage is higher than about 18V.

8. A device comprising:
    a first power supply line carrying a first positive power supply voltage;
    a second power supply line;
    a third power supply line;
    a power supply circuit coupled to the first, the second, and the third power supply lines, wherein the power supply circuit is configured to supply a first positive power supply voltage to the first power supply line, a second positive power supply voltage lower than the first positive power supply voltage to the second power supply line, and a third positive power supply voltage lower than the first and the second power supply voltages to the third power supply line;

a protection circuit comprising:
- an NMOS high-voltage transistor comprising a drain coupled to the first power supply line; and
- a diode comprising an anode coupled to a source of the NMOS high-voltage transistor, and a cathode coupled to the second power supply line; and
- a control bias circuit comprising an output coupled to a gate of the NMOS transistor, wherein the control bias circuit is configured to output a bias voltage to the gate, with the bias voltage being substantially equal to a constant times the first positive power supply voltage, and wherein the control bias circuit is configured to adjust the bias voltage in response to a change in the first positive power supply voltage.

9. The device of claim 8, wherein the constant is smaller than about 0.5.

10. The device of claim 8, wherein the control bias circuit comprises a first and a second resistor coupled in series between the first power supply line and a VSS line, and wherein a node between the first and the second resistors is coupled to the gate of the NMOS high-voltage transistor.

11. The device of claim 8, wherein the drain of the NMOS high-voltage transistor is connected directly to the first power supply line, and the cathode of the diode is connected directly to the second power supply line.

12. The device of claim 8, wherein the NMOS high-voltage transistor has a maximum endurable voltage not lower than the first positive power supply voltage in a full scale.

13. A method comprising:
- during a power on time of a power supply circuit, generating a control bias voltage, wherein during the power on time, a first voltage on a FVDD power supply line rises faster than a second voltage on a HVDD power supply line, wherein the control bias voltage is proportional to, and smaller than, the first voltage, and wherein the FVDD power supply line and the HVDD power supply line receive the first and the second voltages from the power supply circuit respectively;
- during the power on time, turning on a MOS transistor by supplying the control bias voltage to a gate of the MOS transistor;
- during the power on time, pulling up the second voltage on the HVDD power supply line using a source voltage of the MOS transistor; and
- during a normal operation time of the power supply circuit, with the normal operation time being after the power on time, turning off the MOS transistor to stop the step of pulling up the second voltage.

14. The method of claim 13, wherein the control bias voltage is substantially equal to a constant times the first voltage, with the constant being smaller than 1 and greater than 0.

15. The method of claim 14, wherein the constant is between about 0.3 and about 0.5.

16. The method of claim 15, wherein the constant is equal to about 0.5.

17. The method of claim 13 further comprising coupling a diode between a source of the MOS transistor and the HVDD power supply line, with the diode being forwardly biased by the first and the second voltages.

18. The method of claim 13, wherein the step of generating the control bias voltage is performed by using two resistors to divide the first voltage.

* * * * *